`US010257739B1`

United States Patent
Bartur et al.

(10) Patent No.: US 10,257,739 B1
(45) Date of Patent: *Apr. 9, 2019

(54) ANTENNA STATUS AND PROPAGATION MANAGEMENT OVER FIBER OPTIC TRANSPORT

(71) Applicants: Meir Bartur, Los Angeles, CA (US); James Stephenson, Thousand Oaks, CA (US); Farzad Ghadooshahy, Los Angeles, CA (US)

(72) Inventors: Meir Bartur, Los Angeles, CA (US); James Stephenson, Thousand Oaks, CA (US); Farzad Ghadooshahy, Los Angeles, CA (US)

(73) Assignee: Optical Zonu Corporation, Van Nuys, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/871,748

(22) Filed: Jan. 15, 2018

Related U.S. Application Data

(63) Continuation-in-part of application No. 15/285,444, filed on Oct. 4, 2016, now Pat. No. 9,917,638.

(51) Int. Cl.
| | |
|---|---|
| *H04B 10/079* | (2013.01) |
| *H04B 10/2575* | (2013.01) |
| *H04B 10/564* | (2013.01) |
| *H04B 10/69* | (2013.01) |
| *H04B 1/00* | (2006.01) |
| *H04W 24/10* | (2009.01) |
| *G01R 31/11* | (2006.01) |

(Continued)

(52) U.S. Cl.
CPC ............ *H04W 24/10* (2013.01); *G01R 31/11* (2013.01); *H04L 43/50* (2013.01); *H04W 24/02* (2013.01); *H04W 24/08* (2013.01); *H04W 88/085* (2013.01)

(58) Field of Classification Search
CPC .......... H04B 10/0793; H04B 10/25752; H04B 10/564; H04B 10/69; H04B 1/0007; H04W 24/10; H04W 24/02; H04W 24/08; H04W 88/085; G01R 31/11; H04L 43/50
See application file for complete search history.

(56) References Cited

U.S. PATENT DOCUMENTS

| | | |
|---|---|---|
| 6,754,510 B2 | 6/2004 | Hey-Shipton |
| 8,026,725 B2 | 9/2011 | Dalke |

(Continued)

FOREIGN PATENT DOCUMENTS

CN    102104366 A    6/2011

*Primary Examiner* — Mina M Shalaby
(74) *Attorney, Agent, or Firm* — Thomas I. Rozsa

(57) ABSTRACT

A monitoring and troubleshooting system to determine whether or not an antenna that is used for receiving wireless weak signals, like base station for cellular wireless communication, is operational. The antenna status condition is signaled over the Fiber Optic (FO) link without interfering the signal during normal operation. When a fault is detected the status at the FO receiver is determined. Then, an indication using special signaling allows a service technician to distinguish if the status fault is antenna failure or antenna disconnect. The present invention will also allow a service technician to determine if there is a FO link failure by use of light intensity monitoring. The present invention also includes a method of monitoring the status of a radio frequency antenna with the apparatus as discussed above.

5 Claims, 7 Drawing Sheets

(51) Int. Cl.
*H04W 24/08* (2009.01)
*H04L 12/26* (2006.01)
*H04W 24/02* (2009.01)
*H04W 88/08* (2009.01)

(56) References Cited

U.S. PATENT DOCUMENTS

| | | | | |
|---|---|---|---|---|
| 2007/0264009 | A1* | 11/2007 | Sabat, Jr. | H04B 10/1127 |
| | | | | 398/5 |
| 2014/0363158 | A1* | 12/2014 | Chang | H04B 10/2575 |
| | | | | 398/43 |
| 2017/0272172 | A1* | 9/2017 | Lozhkin | H04B 10/541 |

* cited by examiner

ANTENNA STATUS AND PROPAGATION MANAGEMENT OVER FIBER OPTIC TRANSPORT

CROSS-REFERENCE TO RELATED APPLICATION

This patent application is a continuation-in-part of application Ser. No. 15/285,444 filed on Oct. 4, 2016, now pending.

BACKGROUND OF THE INVENTION

1. Field of the Invention

The field of the invention is wireless communication. Specifically, this invention relates to Antennas for base stations in wireless communications.

2. Description of the Prior Art

The following three (3) patents are the closest prior art known to the inventor.

1. U.S. Pat. No. 6,754,510 issued to Hey-Shipton on Jun. 22, 2004 for "Mems-Based Bypass System for Use with a Hts Rf Receiver" (hereafter the Hey-Shipton Patent");

2. U.S. Pat. No. 8,026,725 issued to James A. Dalke on Sep. 27, 2011 for "Optical Fiber Coupled Antenna Current Monitor" (hereafter the "Dalke Patent");

3. Chinese Patent No. CN102104366A issued to Xia Zhou et al. on Jun. 22, 2011 for "Power Amplifying Device for TDD Communication System" (hereafter the "Zhou Patent").

The Hey-Shipton Patent discloses "a bypass system that is used in connection with an HTS-based filter and a cryogenically cooled low noise amplifier (LNA)." This prior art is different than the present invention in that this prior art's innovative feature is a cryocooler working in conjunction with a low noise amplifier. The present invention is different. The present invention is a systematic way to check to see if the Antenna is functioning properly.

Specifically, this invention discloses an HTS-based RF receiver including a cryocooler, a cryogenic enclosure in thermal communication with the cryocooler, an RF input, and an RE output. The receiver also includes an HTS filter having an input and an output, the input of the HTS filter being operatively coupled to the RF input, the output of the HTS being coupled with a LNA, the LNA having an output that is operatively coupled to the RF output. The HIS filter and the LNA are disposed within the cryogenic enclosure. A first Micro-Electro-Mechanical System (MEMS) bypass switch is provided between the RE input and the HTS filter, the first MEMS bypass switch operatively coupling the RF input to the HTS filter. A second MEMS bypass switch is provided between the LNA and the RF output, the second MEMS bypass switch operatively couples the LNA to the RF output. A bypass pathway located in the cold space of the cryogenic enclosure is connected between the first and second MEMS bypass switches.

The objectives of the invention are to provide: an HTS-based RF receiver with a bypass capability, a MEMS-based bypass solution that reduces the overall size of the device and permits the bypass switches to be placed inside a cryogenic environment, and a low insertion point loss bypass system that is used with HTS based RF receivers.

As can be seen from the objectives of this invention, the Hey-Shipton Patent is a completely different invention than the present invention.

The Dalke Patent discloses "a system for detecting the amplitude and phase of current flowing in an antenna element." The Dalke invention is centered around solving the problem of having a long sampling coaxial cable to determine the phase and amplitude of current flowing in an antenna element. The Dalke invention discloses a system for using fiber optic cable instead of long coaxial cables that were normally buried.

The Dalke Patent is different than the present invention in that the Dalke Patent is for comparing the phase angle and amplitude between two elements within the antenna. The present invention is a method for determining if the antenna is functioning properly and if not, troubleshooting where and why it is not functioning. Therefore, the Dalke invention is different from the present invention.

The Zhou Patent discloses "a power amplifying device for a time division duplex (TDD) communication system, which comprises a power amplifier, which is used for amplifying an input transmission signal; a low noise amplifier, which is used for amplifying an input receiving signal; a first switch, which is used for, under a transmitting condition, transmitting the amplified transmission signal to an antenna under the control of a control signal, and, under a receiving condition, inputting a signal received by the antenna to the low noise amplifier under the control of the control signal; a power detector, which is used for measuring the voltage at the output end of the power amplifier and/or at the input end of the low noise amplifier, and outputting an indication signal when the detected voltage meets a predetermined condition; an OR gate, which is used for generating a power control signal at least based on the indication signal to control a power supply of the power amplifier and/or the low noise amplifier. The circuit can be applied to the TDD communication system, such as time division-synchronization code division multiple access (TD-SCDMA), worldwide interoperability for microwave access (WiMAX), long term evolution-time division-synchronization code division multiple access (LTE-TD) and the like, so that the size and weight of the amplifier are reduced, and the noise factor and cost are lowered.

The Zhou Patent discloses an invention in the field of amplifiers. This prior art is for a time division duplex communication device and includes a power amplifier, an input signal amplifier, and a power detector. Specifically, this invention is for amplifying a time division duplex (TDD) communication device not for determining and troubleshooting the functioning of the antenna. Based on these differences the present invention is different than the Zhou Patent.

Many receivers of weak signals deploy Low Noise Amplifier (LNA) at the antenna site. The antenna with its LNA are connected via coaxial cable (coaxial and coax will be used interchangeably throughout this specification) to equipment usually a RF (Radio Frequency) receiver. The electrical power to operate the LNA can be supplied by a local power source next to the antenna or over the same coax that feeds the antenna. This can be accomplished directly from the equipment via another power cable or via a Bias-T injection (Bias T and Bias Tee will be used interchangeably throughout the text) over the same coax cable that feeds the RF power back.

To ensure proper operation, the connection between the receiver equipment and the antenna is monitored or validated by the Bias-T current to the LNA which is between the antenna and the coax cable to the receiver. If the antenna is disconnected, the coax cable to the antenna is open or the antenna amplifier is faulty. In this condition no current flows and the equipment will indicate a malfunction in the antenna.

Low signal level antennas are usually mounted on rooftops or outdoors to eliminate the shielding effects of building materials. For example, GPS location signals are usually very weak or not detectable indoors. Occasionally the distance between the antenna and the equipment is long hence the RF signal attenuation by the coax cable (e.g. RG-58A/U attenuation at 2.4 GHz is 38.9 dB/100 ft) renders the signal too low for useful detection by the receiving equipment. The attenuation due to the coaxial cable also increases the noise figure of the end to end link causing a reduction in effective sensitivity of the receiving equipment.

An example for the need of a weak signal received from an antenna over the air and supplied to an equipment is the modern cellular base station. The need for a weak signal is even greater in later generation Long Term Evolution (LTE) that requires accurate timing signal that is customarily picked up via a GPS antenna and supplied to the base station usually over coax cable.

In order to enable equipment operation when the distance between the antenna and the equipment is too long to be served by a coax cable, Fiber Optic (FO) transport of the RF signal at the output of the antenna's LNA is utilized. Then the FO signal is converted back to RF at the input to the equipment. In such cases the power to the LNA is supplied from another power supply at the vicinity of the antenna and the FO transmitter that is connected to the LNA output. The power to the LNA can be supplied by the same or a separate power source. Also, the connection between the FO transmitter and the Antenna with LNA can be done via a single coax and the FO transmitter. In this system the Electro-Optics (EO) incorporates the Bias-T functionality.

SUMMARY OF THE INVENTION

The present invention is a monitoring and troubleshooting system to determine whether or not an antenna that is used for an equipment, like base station wireless communication, is operational. The antenna status condition is signaled over the Fiber Optic (FO) link without impacting the signal during normal operation. When a fault is detected the status at the FO receiver is determined. Then, an indication using special signaling allows a service technician to distinguish if the status fault is an antenna failure or caused by antenna disconnection. The present invention will also allow a service technician to determine if there is a FO link failure by use of light intensity monitoring.

Technical Problem to be Solved

FO transport of RF signal does not provide the receiving equipment the desired antenna/LNA status indication. The FO transport link may present valid RF power to the equipment but the equipment also monitors the antenna's functionality. Specifically, the equipment monitors whether the LNA is drawing current. To solve such a problem it is common practice (currently/within the prior art) to include an antenna dummy load connected via Bias T at the output of the FO receiver/OE converter. The load draws direct current (DC) from the equipment through the coax cable connection indicating to the equipment that a valid LNA is connected. This connection is permanent and is not providing the true status of the antenna and it's LNA. Therefore, a technician may, by mistake, disconnect the antenna or the coax cable between the FO transmitter or the antenna may be broken or the fiber may be disconnected, or any one of such conditions will eliminate the viable RF signal input to Equipment. Thus, the permanent load will not reflect proper status even under antenna or fiber fault condition.

Advantages of the Invention

It is an object of the present invention to provide a monitoring and troubleshooting system for determining the operational status of an antenna that checks the status of the antenna while not interrupting the functioning of the antenna or wireless communication base station.

It is also an object of the present invention to enable monitoring of the antenna by a receiving equipment where the antenna distance from the equipment necessitate a deployment of Fiber Optic (FO) link and an additional BIAS T detection is implemented and located with the FO transmitter.

It is an additional object of the present invention to have the antenna status condition signaled over the FO link in a way that does not interfere nor affect the RF signal during normal operation. The special signaling is only injected when a fault is detected, hence no impact on normal operation. The signal can be amplitude modulation AM of the optical signal or special tone injection or digital code insertion.

It is a further object of the present invention to provide a troubleshooting and monitoring system that allows the status at the antenna to be detected and be presented at the FO receiver to actively engage a DC bias load to reflect the antenna status to the receiving equipment.

It is still a further object of the present invention to provide an indication to a service technician to distinguish between antenna failure (or disconnect) and optical transmitter failure via special signaling.

It is still a further object of the present invention to provide an indication to a service technician to distinguish between antenna failure (or disconnect) OR optical transmitter failure OR fiber connection failure (e.g. disconnect or fiber cut) via special signaling AND optical signal monitoring. This enables a service technician at the equipment side to determine the root cause of signal loss at the equipment. System Check of the Antenna Active BiasT current simulation within the FO receiver. When the fiber link is OK AND the antenna is OK active DC load is engaged at the FO receiver signaling "good" antenna to the Receiver equipment.

Detection of the antenna load condition at the FO Transmitter and transport of the information from the antenna to the equipment via FO and engaging the equipment via control of the current drawn from the equipment via the BiasT.

Transport of the information from the antenna to the equipment is done in the following manner:

a. When the antenna load current is detected and the value is in the proper range indicating fully functional antenna, normal FO transmitter operation (nominal light intensity and RF Modulation of the incoming RF signal).

b. When the antenna load current is detected and the value is NOT in the proper range (including the case of no current at all when the coax cable is open or any inline failures such as in line lighting protection device) indicating antenna malfunction by changing the Laser bias current and/or modulation scheme at the FO Transmitter. Such change can be to a steady state value vastly different than normal operation OR modulating the bias current with low frequency signal (e.g. 50% duty cycle on/off at 1 Hz rate) or any other mean of status information injection.
  c. Monitoring the signaling status condition of the incoming light.
     i. If within range, both the antenna and the FO link will have signal status OK. This indicates proper operation by engaging the DC load simulator and indicating good link all the way from the antenna.
     ii. If the incoming light is not within range, modulated detection or simple level detection; then, signaling antenna malfunction is indicated by disengaging the load simulator while still maintaining a good optical link indication.
     iii. No incoming light indicates open fiber or low level incoming light indicating high fiber link attenuation. Thus signaling malfunction by disengaging the load simulator, and an additional indicator (e.g. red LED) which indicates a failed optical link.

Additional functionality can be added. Specifically, for GPS signal transport by deploying a full GPS receiver either at the FO Transmitter or at the FO Receiver. The output from the satellite receiver can include a status output to indicate a lock on a valid GPS signal. Such and indicator is useful for installation and troubleshooting.

Additional functionality can be added to enable automatic switching to another antenna and or another fiber link producing fault tolerant redundant operation.

The present invention is also a method for determining: (1) whether the Radio Frequency (RF) Antenna is operational; and (2) whether the RF Antenna's received signals are properly transported into a receiving equipment through fiber optic link functions. The fiber optic link functions are selected from the group consisting of: antenna with LNA (Low Noise Amplifier), electro optic converter that transmits the received signal over fiber optic cable, and optic electric converter that receives the optical signals and converts the optical signals back to RF signals. In addition, the present invention includes means to detect antenna faults, or electro optic converter faults and/or fiber faults. The present invention further contains an indicator or monitor that is connected to the equipment that provides a good signal and/or good link indication.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DETAILED DESCRIPTION OF EMBODIMENTS OF THE PRESENT INVENTION

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

For clarity of this invention over the prior art, a detailed description of the existing technology/prior art is included and discussed in FIG. 1, FIG. 2, FIG. 3 and FIG. 4. The present invention is then illustrated in FIG. 5, FIG. 6, and FIG. 7.

Prior Art/Existing Technology Prior to the Current Invention

Figure 1:
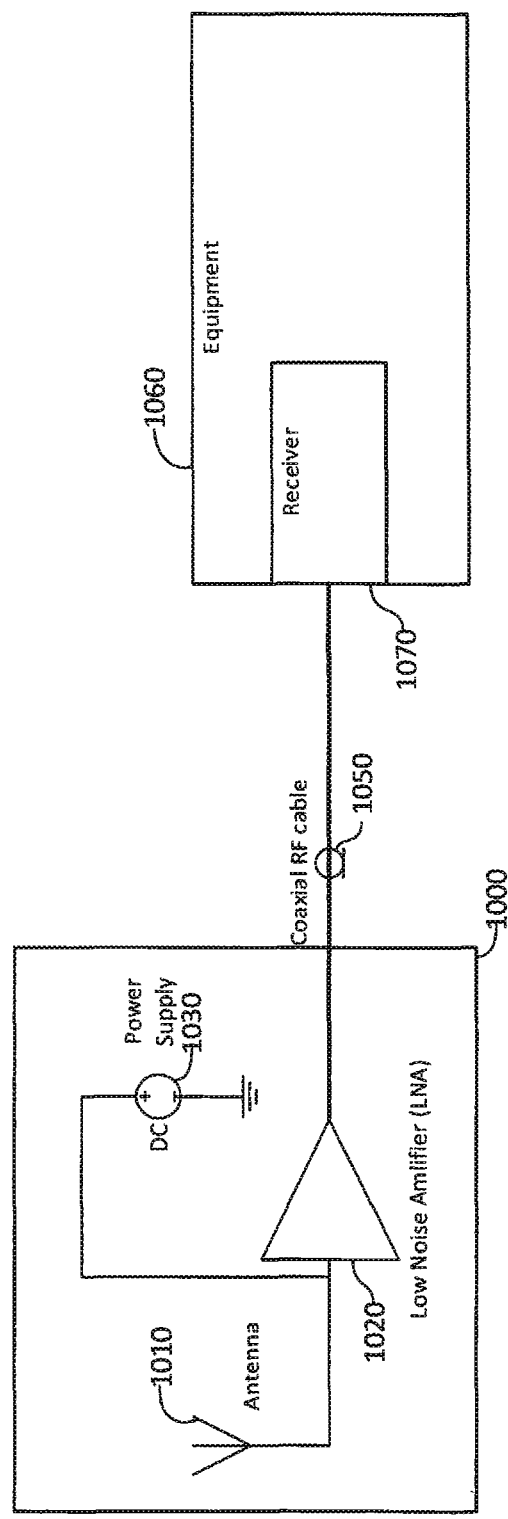
FIG. 1 is an illustration of a prior art—Coax Link between antenna and equipment.

Referring to FIG. 1 (Prior Art), FIG. 1 illustrates a system including an antenna assembly (1000) and an equipment (1060) connected via RF Coax cable (1050). The antenna assembly 1000 contain Low Noise amplifier (1020) that is designed to be next to the antenna and amplify the signals received by the antenna (1010) and a power supply that can be battery operated or connected to external power source (either DC or AC). This assembly (1000) is powered independently and provide an amplified RF signal on the RF Coax cable (1050) into the receiver element (1070) at the equipment (1060). Such connections are common for radio frequency communication, satellite receiving signals, cellular base stations etc.

Figure 2:
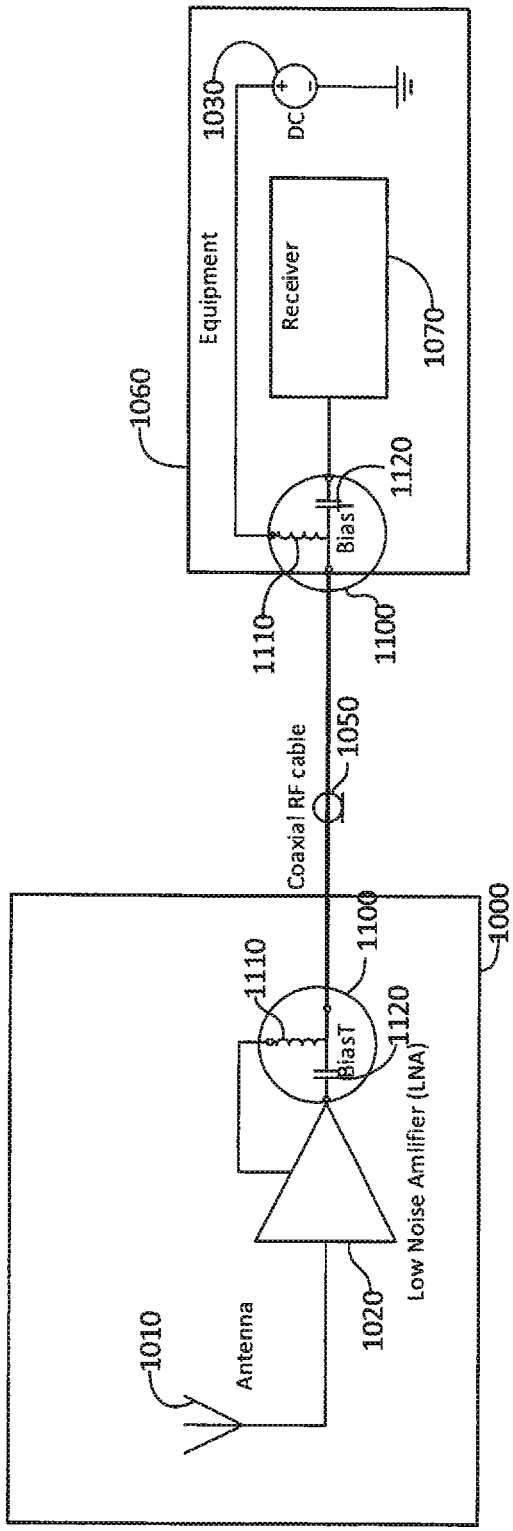
FIG. 2 is an illustration of a prior art Bias T connection—equipment supplying power to the LNA.

Referring to FIG. 2 (Prior Art), FIG. 2, illustrates a system design to eliminate the need for an independent power supply at the antenna side (1000). FIG. 2 illustrates an antenna assembly (1000) and an equipment (1060) connected via RF Coax cable (1050). The antenna assembly (1000) contain Low Noise amplifier (1020) that is designed to be next to the antenna and amplify the signals received by the antenna (1010) but does not have an independent power. Antenna assembly (1000) is powered by DC power supplied over the same RF Coax cable (1050) that connects the antenna assembly (1000) to the equipment (1060). The DC power source (1030) at the equipment (1060) is coupled into the coax RF cable (1050) via Bias-T circuit (1100). BiasT circuit (1100) has 2 components—(1) capacitor (1120) to couple the RF signals in/out of the coax cable and blocking the DC current, and (2) inductor (1110) that couples the DC source in/out of the RF cable and blocking the RF signals. At the antenna assembly (1000) the DC power is delivered to the LNA (1020) through another BiasT (1100) that is connected via RF Coax cable (1050). Such simplified connections, that eliminate the need for a power source at the antenna, are common for radio frequency communication, satellite receiving signals, cellular base stations etc.

Figure 3:
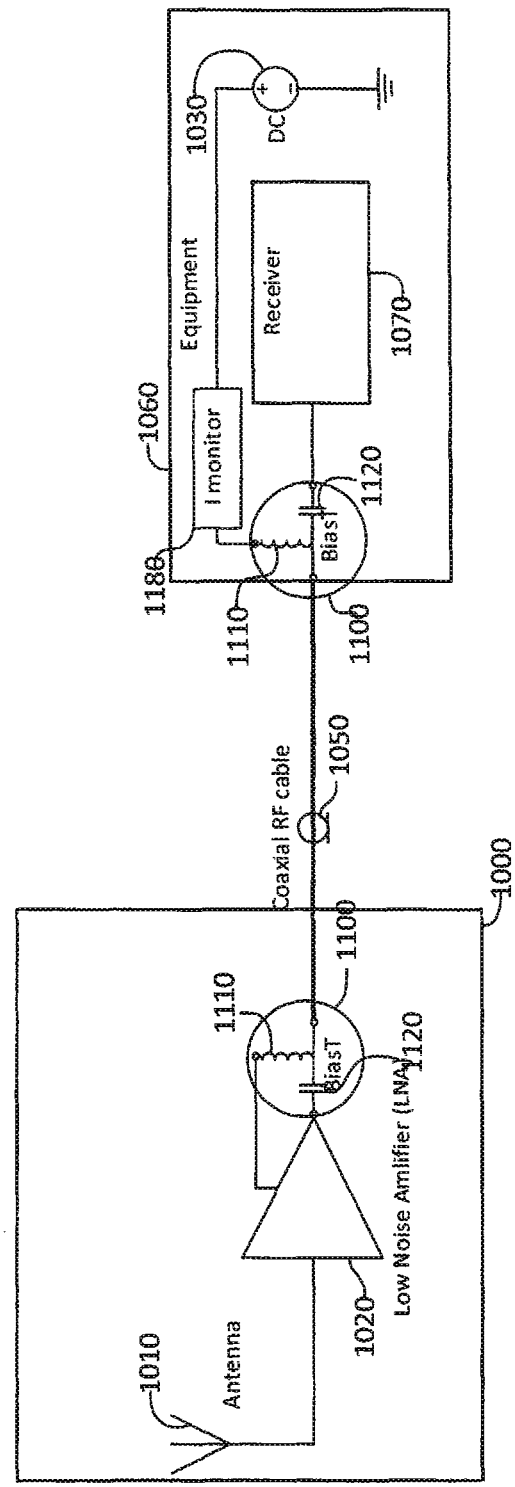
FIG. 3 is an illustration of a prior art—Bias T monitoring of the current at the equipment.

Referring to FIG. 3 (Prior Art), FIG. 3 illustrates a system similar to the one in FIG. 2 with the added feature of monitoring the DC current supplied to the antenna (1010). The DC current is supplied through 2 BiasT circuits. One of the Bias T (1100) is on the side of Antenna Assembly (1000) and another of the Bias T (1100) is on the side of equipment (1060). By monitoring the current the operator of the equipment (1060) can find out if the coax is open (antenna is not connected) because no DC current will flow to antenna (1010). If the LNA (1020) is not functioning properly its DC current will reflect that so that at the equipment side the root cause of the RF signals faulty performance (e.g. no RF signal for an open cable, faulty in line lightning protectors, very low signals if the LNA is malfunctioning, etc.) can be discerned.

Figure 4:
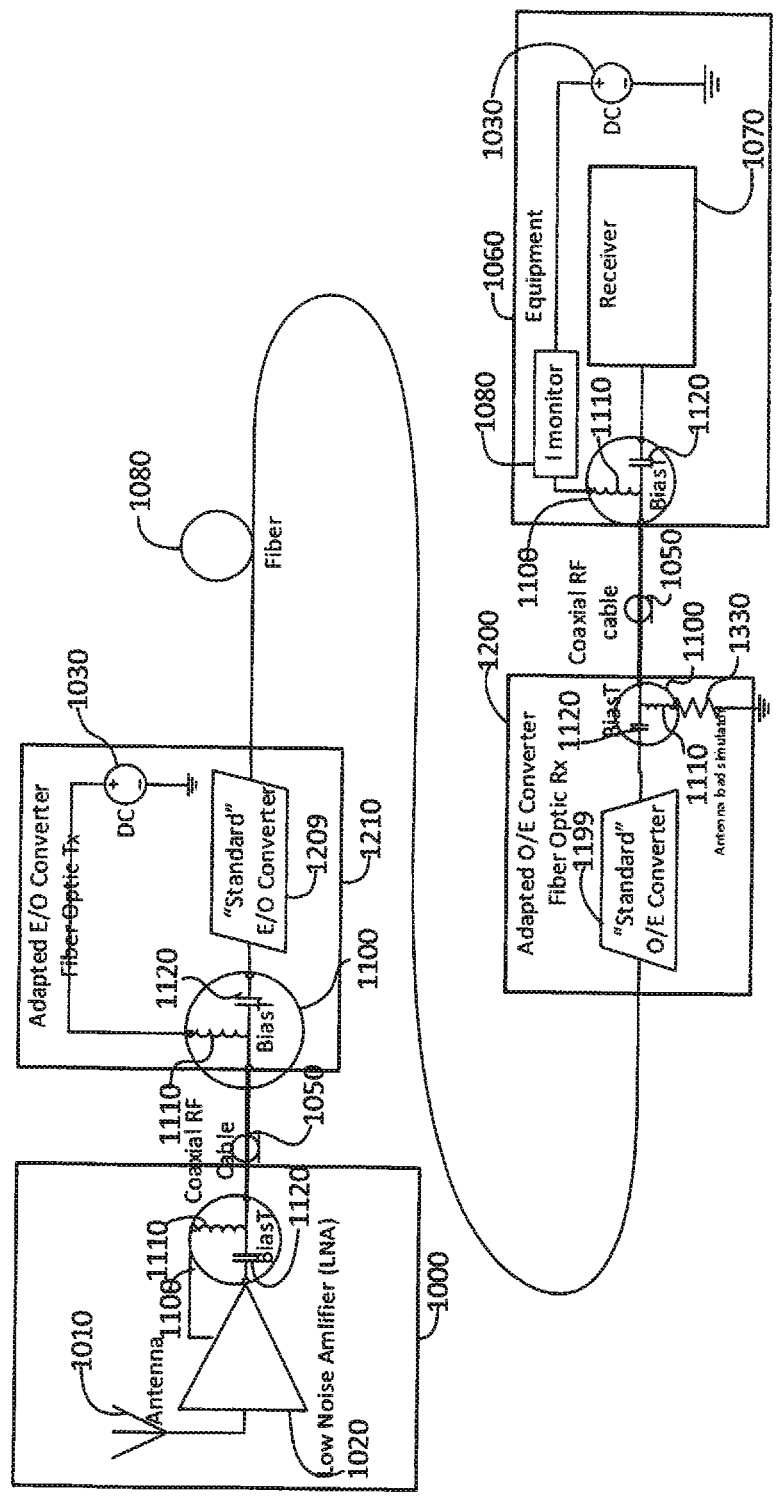
FIG. 4 is an illustration of a prior art fiber optic link from the antenna with Dummy Load to simulated properly functioning, connected, antenna.

Referring to FIG. 4 (Prior Art), FIG. 4 illustrates a system similar to the one in FIG. 3 but with a large distance between the equipment (1060) and the antenna assembly (1000). Due to the fact that RF cable attenuates the signal, one of the practical ways to connect an antenna to an equipment over long distance is utilizing optical fiber that has significantly lower attenuation for optical signals. E/O (Electrical to optical) converters and O/E (Optical to electrical) converters are well known in the market. Standard E/O (1209) and O/E (1199) converters are utilized to build an adapted set of RF connectivity to an antenna that includes the DC biasing required by the Antenna (1010). An adapted Electro Optic converter (E/O electrical to Optical) (1210) at the antenna site connects to the antenna via RF Coax cable (1050) to convert the RF signals to modulated optical signals and transmit those over fiber (1080) to O/E converter (1200) that converts the optical signal back to RF to be provided over coax (1050) to the equipment (1060). The adapted converter (1210) also contains a DC power supply (1030) that in addition to powering the converter (1210) is also fed via BiasT (1120) to the antenna via the RF cable. At the equipment site an adapted Optic to Electric converter (1200) is used to convert the RF signals from the optical domain to the electrical domain and is feeding the RF signal to the equipment (1060) via RF Coax cable (1050). Since the equipment 1060 is monitoring the DC current (1080) special features are added to the adapted O/E converter (1200) to simulate load of a proper functioning antenna. The load is connected at the O/E converter (1200) via BiasT 1100 to RF Coax cable (1050). The RF signals are passing through the BiasT and the DC current is flowing to a Dummy Load (1330) that ensure DC current from the equipment (1060) power supply (1030) and functions as an Antenna Load simulator. The monitor current (1080) is "fooled" to measure the right current and does not issue an alarm in the equipment side (1060). However the problem with such implementation is that the real antenna status is masked. Thus, the equipment is presented with a good antenna indication (via the DC current flowing through the antenna connection) that is completely detached and unrelated to the real antenna status.

Figure 5:
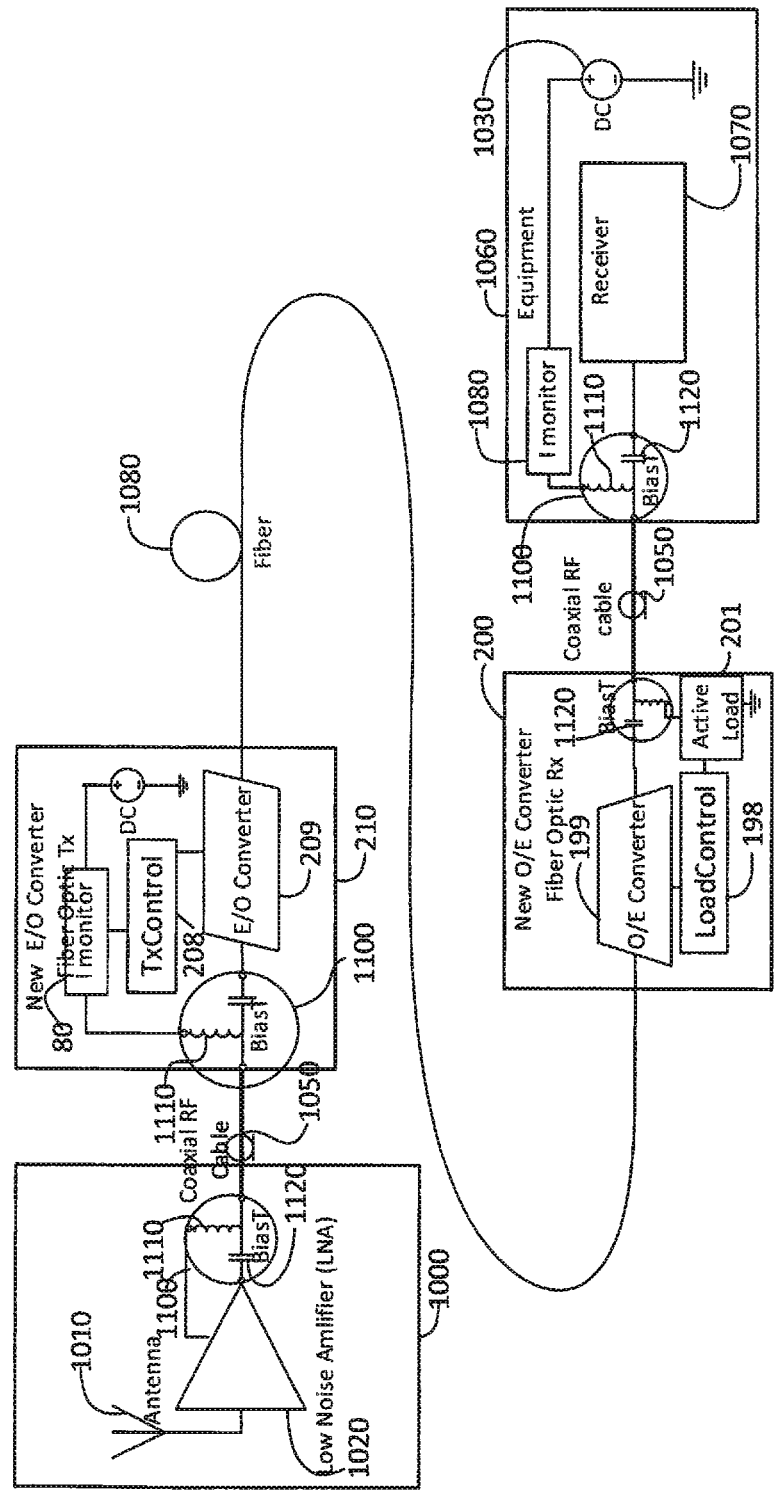
FIG. 5 is an illustration of a status detection at the fiber optic transmitter and active load signaling at the FO Receiver of the present invention.

The Present Invention/Detailed Description of the Figures for the Present Invention Referring to FIG. 5 (Present Invention), FIG. 5 depicts a system similar to the one in FIG. 4 but deploys additional elements and controls to solve the problems associated with the prior art as explained above. The RF path depicted in prior art remains intact. However, at the O/E converter connected to the Antenna a current monitor (80) is introduced to measure the current flowing from the DC Power source. This current is monitored by the TxControl (208). If the value of the DC current is out of normal range expected from a functioning antenna the TxControl (208) controls the E/O Converter (209) to signal such out of range indication. For example, TxControl (208) can turn off the light completely, pulse (turn off and on repeatedly), change the DC level, or by other signaling means that controls the amplitude of the optical signal. At the Equipment side the new O/E converter contains a Load Control element (198) that reads the optical signal at the O/E converter (199) and if an out of range signal (of the antenna current) is detected it controls an active load that changes the current that the equipment (1060) is monitoring. Such an arrangement can, for example, cut the current completely indicating to the equipment that the antenna is disconnected. The actual monitoring of analog properties such as photocurrent and antenna current are done by an ADC (analog to digital converter). This is usually a part of the uC (micro-controller) such as Freescale (NXP) or Silab implemented in the optical E/O and O/E and are common in the field of RF and Fiber transceiver design.

Further referring to FIG. 5, the present invention is also: (1) a method for determining whether the Radio Frequency (RF) Antenna (1010) is operational; and (2) whether the RF Antenna's (1010) received signals are properly transported into receiving equipment (1060) through fiber optic link functions. The fiber optic link functions are selected from the group consisting of: antenna with LNA (Low Noise Amplifier) (1020) and electro optic converter (209) that transmit the received signal over a fiber optic electric converter (199) that receives the optical signals and converts the optical signals back to RF signals. The present invention also includes means to detect antenna faults, or electro optic converter faults and/or fiber faults. The present invention further contains an indicator or monitor (1080) that is connected to the equipment (1060) that provides a good signal and/or good link indication.

Figure 6:
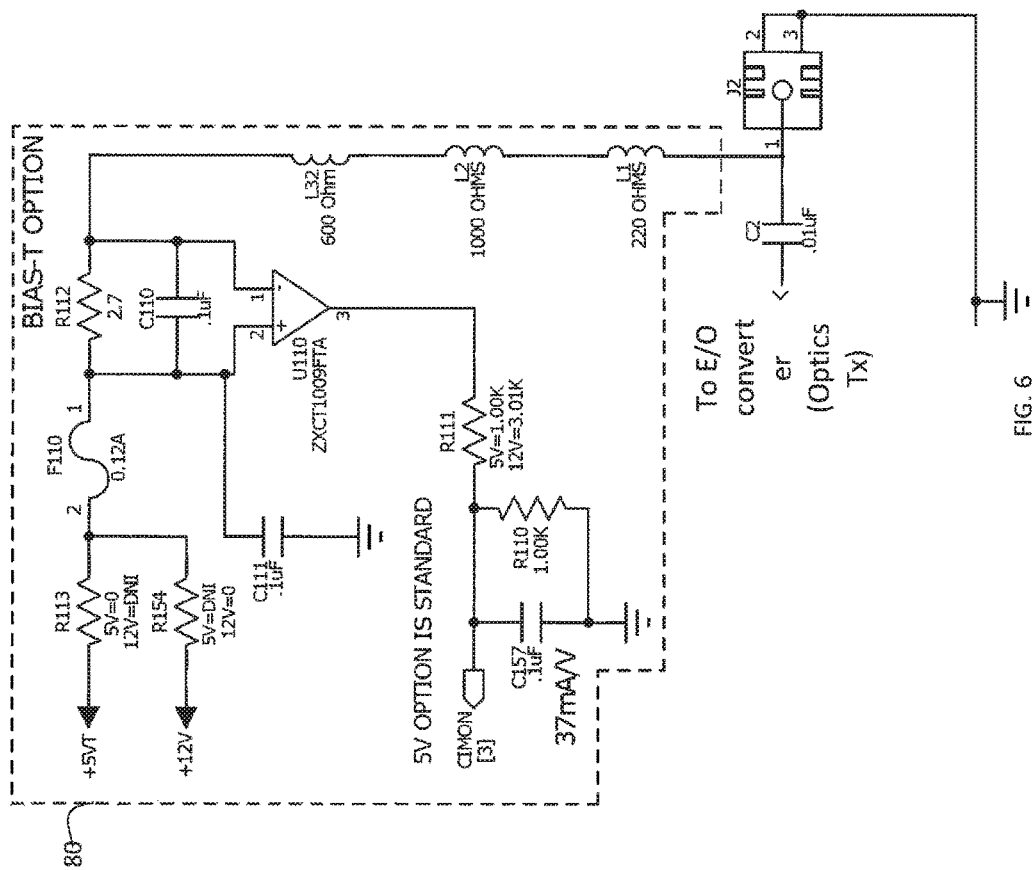
FIG. 6 is an illustration of the actual implementation of Bias-T current and antenna current monitoring at the optical transmitter (E/O) of the present invention.

Referring to FIG. 6 (Present Invention), FIG. 6 depicts an implementation of antenna current sense (80) according to current invention. The connector to the antenna is J2. The biasT is implemented by C2 and L1, L2 & L32. The current is supplied to the antenna from a power supply. The design example enable operation from either 5V or 12 V source depending on the choices for R113 and F110. DNI is do not install. Current sensing in this example is performed by U110—a special low voltage drop high-side current monitor IC (ZXCT1009 made by DIODES Inc.). The analog value provided to the uC that runs the E/O (optical Tx) is scaled to 37 mA/V. In the uC monitors the value and uses programmed limits to evaluate if the antenna current is in proper range. If not than an antenna alarm state must be sent to the Equipment (1060) via the fiber link (1080) and the O/E converter (199). One way to do so it to control the amplitude of the transmitted light by controlling the optical transmitter. For example we can turn the laser on and off every 1 sec done by the TxControl (208) which is part of the E/O converter (210). At the O/E converter (199) the optical power indicator (a typical signal detect control line that is high when the optical incoming light is within an expected range) will blink at 1 sec interval indicating that the link is OK (optical signal are being transported) and the state of disconnected antenna is properly transmitted and recognized at the Load Control (198) that analyzes the signal level received by the O/E converter (199).

Figure 7:
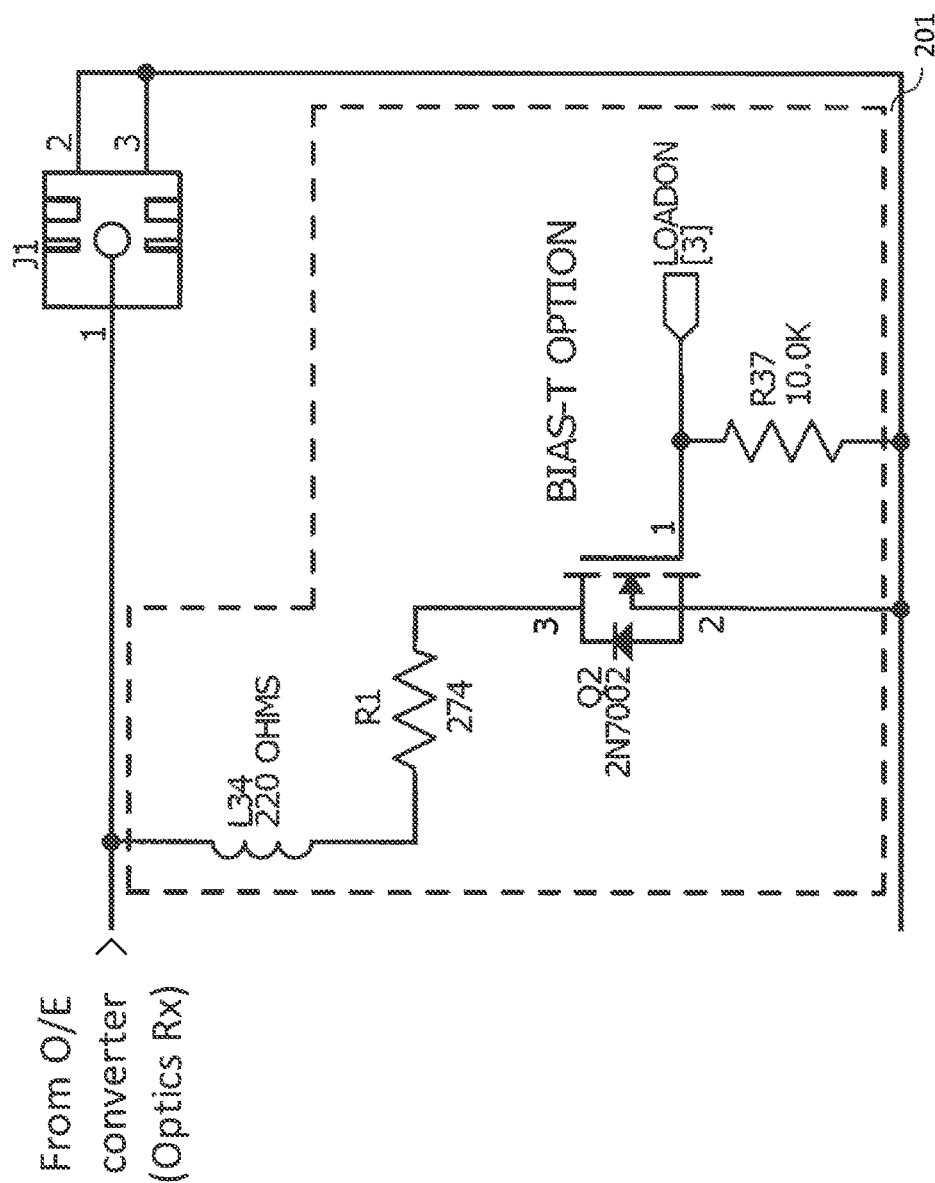
FIG. 7 is an illustration of the actual implementation of active antenna load simulator at the optical receiver (O/E) of the present invention.

Referring to FIG. 7 (Present Invention), FIG. 7 depicts an implementation of active load (201) according to current invention. Upon detection of a good optical signal at the O/E converter (199) the local uC can operate the control line LOADON [3] hence providing a DC load that is signaling to the Equipment (1060) via connector J1 to RF Coax cable (1050) that an antenna is connected. The I monitor (1080) at the Equipment (1060) will properly indicate good antenna to the operating software at the Equipment (1060). If there is no optical light or if there is a signal from the E/O converter that the antenna is not properly functioning, then the LOADON [3] control will disconnect the current and properly indicate thus to the equipment (1060).

In addition, at the O/E converter it is possible to indicate to a technician the reason that the proper signal is not available to the Equipment (1060). If there is no optical light at all it means that the fiber optic link is broken while if there is a signal of a failed antenna the fiber optic link is OK and the antenna failure is indicated.

It is clear to anyone familiar with the art that the information thus received can be utilized to create a fail-safe system. A system with two independent antennas and two independent fibers can be built that based on the information provided will use the antenna with proper current and the fiber link that is not broken.

Of course the present invention is not intended to be restricted to any particular form or arrangement, or any specific embodiment, or any specific use, disclosed herein, since the same may be modified in various particulars or relations without departing from the spirit or scope of the claimed invention hereinabove shown and described of which the apparatus or method shown is intended only for illustration and disclosure of an operative embodiment and not to show all of the various forms or modifications in which this invention might be embodied or operated.

What is claimed is:

1. A method for monitoring the status of a radio frequency antenna comprising:
   a. connecting a radio frequency antenna to equipment;
   b. connecting a fiber optic link between said radio frequency antenna and said equipment;
   c. connecting a first monitor having a current sensor monitor to detect if said radio frequency antenna current is within operating range;
   d. sending a signal when antenna current is not within operating range; and
   e. connecting a monitor to said equipment to provide a good signal and/or a good link indication;
   f. whereby, operational status and cause of failure of said radio frequency antenna is checked and communicated without impacting operation of antenna.

2. The method of monitoring the status of a radio frequency antenna in accordance with claim 1, further comprising: a low noise amplifier is connected to said radio frequency antenna.

3. A method for monitoring the status of a radio frequency antenna comprising:
   a. connecting a radio frequency antenna to equipment;
   b. connecting a fiber optic link between said radio frequency antenna and said equipment;
   c. connecting a first monitor having a current sensor monitor to detect if said radio frequency antenna current is within operating range; and
   d. sending a signal when antenna current is not within operating range;
   e. whereby, operational status and cause of failure of said radio frequency antenna is checked and communicated without impacting operation of antenna.

4. The method of monitoring the status of a radio frequency antenna in accordance with claim 3, further comprising: a monitor is connected to said equipment to provide a good signal and/or a good link indication.

5. The method of monitoring the status of a radio frequency antenna in accordance with claim 3, further comprising: a low noise amplifier is connected to said radio frequency antenna.

\* \* \* \* \*